United States Patent
Nagatomo (10) Patent No.: US 6,873,554 B1
(45) Date of Patent: Mar. 29, 2005

(54) SEMICONDUCTOR MEMORY DEVICE

(75) Inventor: Masahiko Nagatomo, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/675,829

(22) Filed: Oct. 1, 2003

(30) Foreign Application Priority Data

Oct. 3, 2002 (JP) .................................... 2002-291116

(51) Int. Cl.$^7$ ............................................. G11C 7/00
(52) U.S. Cl. ............................ 365/189.11; 365/185.18; 365/189.09
(58) Field of Search .................. 365/189.11, 185.18, 365/189.09, 230.03, 185.23

(56) References Cited

U.S. PATENT DOCUMENTS 6,233,177 B1 * 5/2001 Shokouhi et al. ...... 365/185.23

FOREIGN PATENT DOCUMENTS

| JP | 06-215585 | 8/1994 |
|---|---|---|
| JP | 06-342598 | 12/1994 |
| JP | 2000-011668 | 1/2000 |

* cited by examiner

*Primary Examiner*—David Lam
(74) *Attorney, Agent, or Firm*—Volentine Francos & Whitt PLLC (57) ABSTRACT

There is provided a semiconductor memory device capable of eliminating the occurrence of delays in access when switching from a standby state to an active state. A drain voltage generator 10A generates a predetermined drain voltage MCD which is low in driving performance owing to PMOS15, 17 and NMOS16, 18 each having large ON resistance irrespective of the presence of a chip selection signal and apply the drain voltage to each of memory arrays. When read operation is started when a chip selection signal /CE goes "L", the drain voltage MCD is generated by PMOSs 11, 15 and NMOSs 12 to 14 with a predetermined driving performance. As a result, a predetermined drain voltage MCD is always applied when switching from a standby state to an active state, thereby eliminating the occurrence of delays in access to a memory cell.

5 Claims, 6 Drawing Sheets

SEMICONDUCTOR MEMORY DEVICE
ACCORDING TO FIRST EMBODIMENT OF THE INVENTION

FIG. 1

SEMICONDUCTOR MEMORY DEVICE
ACCORDING TO FIRST EMBODIMENT OF THE INVENTION

FIG. 2(PRIOR ART)

CONVENTIONAL SEMICONDUCTOR MEMORY DEVICE

FIG. 3

SEMICONDUCTOR MEMORY DEVICE
ACCORDING TO SECOND EMBODIMENT OF THE INVENTION

FIG. 4

SIGNAL WAVEFORMS SHOWING
OPERATION OF DRAIN VOLTAGE GENERATOR IN FIG. 3

FIG. 5

SEMICONDUCTOR MEMORY DEVICE
ACCORDING TO THIRD EMBODIMENT OF THE INVENTION

FIG. 6

SIGNAL WAVEFORMS SHOWING
OPERATION OF DRAIN VOLTAGE GENERATOR IN FIG. 5

FIG. 7

MEMORY ARRAY ACCORDING
TO FOURTH EMBODIMENT OF THE INVENTION

FIG. 8

MEMORY ARRAY ACCORDING
TO FIFTH EMBODIMENT OF THE INVENTION

FIG. 9
MEMORY ARRAY ACCORDING
TO SIXTH EMBODIMENT OF THE INVENTION

US 6,873,554 B1

SEMICONDUCTOR MEMORY DEVICE

BACKGROUND OF THE INVENTION

1. Field of the Invention

The invention relates to an electrically writable non-volatile semiconductor memory device, particularly to a circuit for generating a drain voltage to be applied to a specific memory cell during read operation.

This application is a counterpart of Japanese patent application. Serial Number 291116/2002, filed Oct. 3, 2002, the subject matter of which is incorporated herein by reference.

2. Description of Related Art

There are following related related arts.

JP 2000-11668A

JP 1994-215585A

JP 1994-342598A

Figure 2:
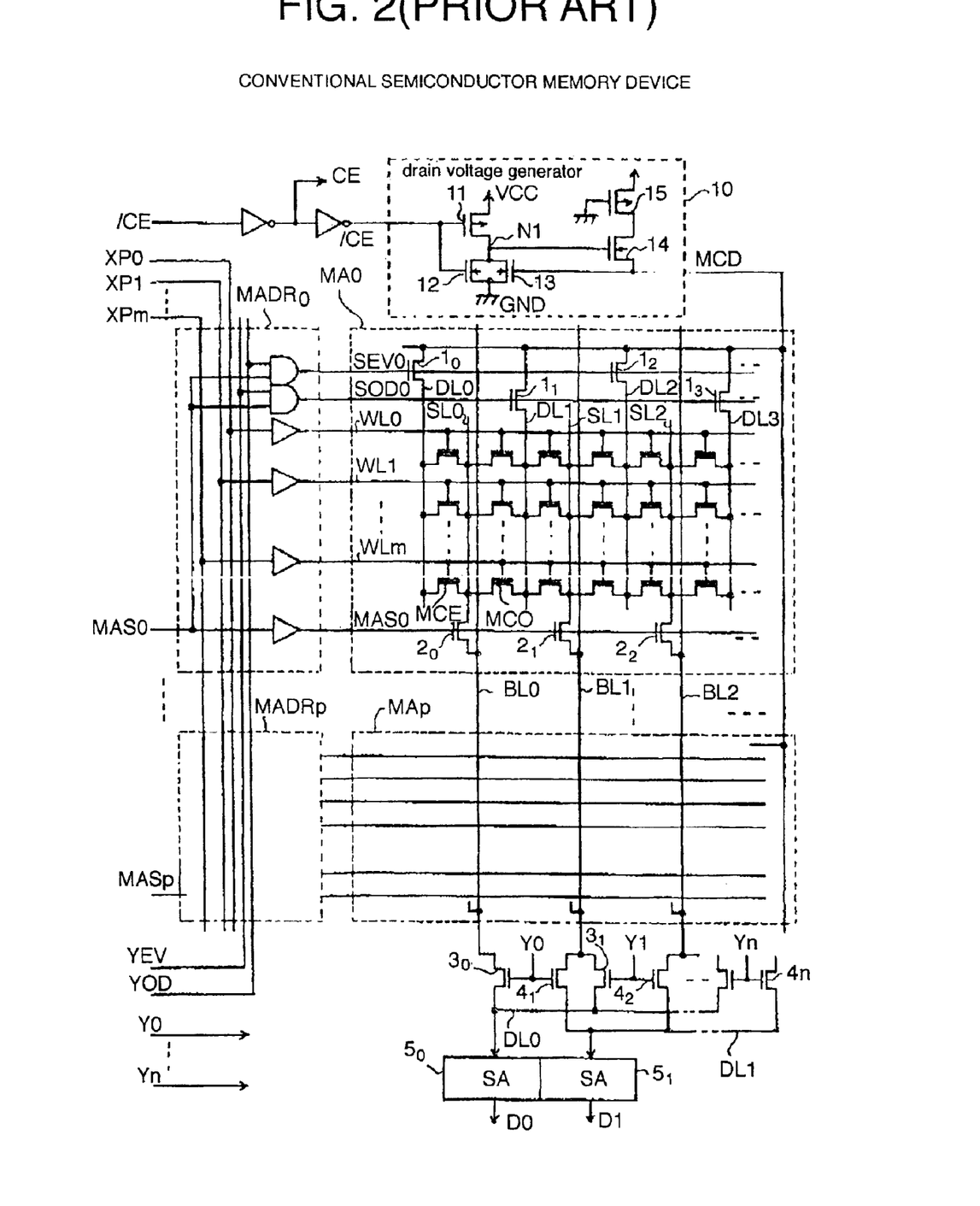
FIG. 2 is circuit configuration showing one example of a conventional semiconductor memory device.

FIG. 2 is a circuit configuration showing an example of a conventional semiconductor memory device.

This semiconductor memory device is an electrically writable non-volatile memory, and has a plurality of memory arrays MAk (k=0 to p). Each of the memory array MAk has the same configuration, and has a plurality of word lines WLi (l=0 to m), which are arranged in parallel with one another, and a plurality of drain lines DLj (j=0 to n) which are arranged to intersect the word lines WLi, wherein a plurality of source lines SLj are arranged in parallel with one another between the drain lines DLj and DLj+1.

Memory cells MCEi, j are arranged at the point of intersection between the word lines WLi, drain lines DLj, and source lines SLj, and memory cells MCOi, j are arranged at the point of intersection between the word lines WLi, drain line DLj+1, and source lines SLj. Numerical subscripts such as i, j and so forth are omitted in the following description except in the case where constituting components are specified concretely.

The memory cells MCE, MCO are a field-effect transistor (hereinafter referred to as FET) having a floating gate, wherein a control gate, a drain and a source of the FET are respectively connected to the corresponding word lines WL and drain lines DL, and source lines SL.

In the case where an electric charge is absent on each floating gate of the memory cells MCE, MCO, a threshold voltage of the FET is lowered so that the FET turns ON (e.g., memory content "1"), while in the case where the electric charge is present, the threshold voltage of the FET is increased so that the FET turns OFF (e.g., memory content "0"). Since the floating gate is isolated from other electrodes, if a high voltage is applied to the word lines WL to accumulate the electric charge, the memory content is stored even upon power-down.

Each of the drain lines DLj are connected to the drain voltage MCD via an n-channel MOS transistor (hereinafter referred to as NMOS). An even numbered selection signal SEV is supplied to each gate of NMOS$1_j$ of even numbered and an odd numbered selection signal SOD is supplied to each gate of the NMOS$1_j$ of odd numbered, wherein they are subjected to on-off control.

Further, the source lines SLj are connected to bit lines BLj via an NMOS$2_j$ which are in common subjected to on-off control in response to a memory array selection signal MAS. The source lines SLj of the memory arrays MA are connected to the bit lines BLj via the NMOS$2_j$.

Still further, the bit line BL0 is connected to a data line DL0 via an NMOS$3_0$, and a bit line BLn is connected to a data line DL1 via an NMOS$4_n$. Further, bit lines BL$_1$ to BL$_{n-1}$ are connected in common to the data lines DL0, DL1 via NMOS $3_1$ to NMOS$3_{n-1}$ and NMOS $4_1$ to NMOS$4_{n-1}$. Each of the NMOS $3_j$ and NMOS$4_{j+1}$ is subjected to on-off control in response to a bit line selection signal Yj, respectively.

The data lines DL0, DL1 are connected to sense amplifiers (SA) $5_0$, $5_1$, and data D0, D1 each having a predetermined logical level are outputted from the sense amplifiers $5_0$, $5_1$.

The selection signal relative to the word lines WL of each memory array MA, the even numbered selection signal SEV, the odd numbered selection signal SOD, and the memory array selection signal MAS are supplied from corresponding memory array driving circuits MADRs in response to word line selection signals XP0 to XPm, memory array selection signal MAS0 to MASp, and even and odd numbered selection signals YEV and YOD which are outputted from an address decoder, not shown, respectively. Bit line selection signals Y relative to the NMOSs 3, 4 are supplied from the address decoder. Meanwhile, the drain voltage MCD to be applied in common to each memory array MA is generated by a drain voltage generator 10.

The drain voltage generator 10 generates the drain voltage MCD (e.g., 1.2V) which is sufficiently lower than a power supply voltage VCC (e.g., 3V) for read operation of each memory array MA when the semiconductor memory device is rendered in an active state in response to a chip selection signal /CE ("/" is inverting symbol).

The drain voltage generator 10 has a p-channel MOS transistor (hereinafter referred to as PMOS)11 and an NMOS12 which are controlled in conductive state by the chip selection signal /CE. A source of the PMOS11 is connected to the power supply voltage VCC, and a drain thereof is connected to a node N1. A drain of the NMOS12 is connected to the node N1 and a source thereof is connected to the ground voltage GND.

Further, a drain of an NMOS13 is connected to the node N1, and a source and a gate thereof are connected to the ground voltage GND and a node N2. A source of an NMOS14 is connected to the node N2, and a gate of the NMOS14 is connected to the node N1. A drain of the NMOS14 is connected to the power supply voltage VCC via a PMOS15 a gate of which is connected to the ground voltage GND. The drain voltage MCD is outputted from the node N2.

An operation of the conventional semiconductor memory device is described next.

With the semiconductor memory device having the foregoing configuration, in the case where read operation is effected relative to the memory cell, the chip selection signal /CE goes "L", thereby setting an active state. Accordingly, the PMOS11 and NMOS12 turn ON and OFF, respectively, and the voltage of the node N1 goes "H". When the voltage of the node N1 goes "H", the NMOS14 turns ON, and the node N2 is connected to the power supply voltage VCC via the NMOS14 and the PMOS15, thereby increasing the voltage of the node N2. The voltage of the node N2 is fed back to the gate of the NMOS13, so that the NMOS13 turns ON.

As a result, a voltage obtained by dividing the power supply voltage VCC by the PMOS11 and the NMOS13 is outputted to the node N1. The voltage of the node N1 is further applied to the gate of the NMOS14. With such a feedback loop, the drain voltage MCD outputted from the node N2 becomes about 1.2 V which is sufficiently lower than the power supply voltage VCC. Accordingly, there is no fear that data is erroneously written in the memory cell during read operation, so that the memory content is not changed but held in the memory cell.

Meanwhile, in the case where no read operation is effected relative to the semiconductor memory device, the chip selection signal /CE goes "H", thereby setting a standby state. Accordingly, the PMOS11 and the NMOS12 of the drain voltage generator 10 turn OFF and ON, respectively, and the voltage of the node N1 becomes the ground voltage GND. When the voltage of the node N1 becomes the ground voltage GND, the NMOS14 turns OFF to set the node N2 in an open state. As a result, the drain voltage MCD is not outputted but substantially goes the ground voltage GND owing to leakage resistance and so forth. Accordingly, a drain current does not flow to each memory array MA, thereby reducing a current consumption in the standby state.

However, the conventional semiconductor memory device has following problems.

If the number of memory arrays and bit lines increase as a memory capacity increases, the entire length of wires through which the drain voltage MCD is supplied lengthens, thereby increasing a load caused by a parasitic capacitance of the wires and the like. Accordingly, if a standby state is switched to an active state in response to the chip selection signal /CE, the rising of the drain voltage MCD to be applied to each memory array MA delays, causing a problem that a normal read operation is not effected.

SUMMARY OF THE INVENTION

The invention has resolved the problems of the conventional semiconductor memory device and it is an object of the invention to provide a semiconductor memory device having an MCD generator in which acsess delay does not occur when switching from a standby state to an active state.

To achieve the above object, the semiconductor memory device of the first aspect of the invention is made up of an electrically writable non-volatile semiconductor memory device and comprising a voltage generator for generating a drain voltage to be applied to a read-out subject memory cell during read operation, wherein the voltage generator is made up of first generating means for generating the drain voltage with a predetermined driving performance when an operation enable signal is supplied thereto, and second generating means for generating the drain voltage with a driving performance which is lower than the predetermined driving performance irrespective of the presence or absence of the operation enable signal.

Since the semiconductor memory device of the first aspect of the invention has configured as set forth above, the following operation is effected.

In the voltage generator, the drain voltage is generated by the second generating means with a driving performance which is lower than the predetermined driving performance irrespective of the presence of the operation enable signal and it is applied to the memory cell. When the read operation enable signal is supplied to the first generating means, the drain voltage is generated by the first generating means with the predetermined driving performance, and it is applied to a read-out subject memory cell. As a result, the drain voltage is always held at the predetermined voltage, thereby obtaining an advantage of eliminating the occurrence of delays in access.

The second aspect of the invention is configured such that the voltage generator temporarily sets a drain voltage at a value higher than a predetermined voltage when an operation enable signal is supplied thereto.

The third aspect of the invention is configured such that the voltage generator is made up of voltage generating means for generating the drain voltage having a predetermined value by feed backing an output voltage to an input side based on an operation enable signal, and feedback stop means for temporarily stopping the feedback of the output voltage to increase the drain voltage when the operation enable signal is supplied thereto.

According to the second or third aspect of the invention, the drain voltage generated in the voltage generator is temporarily higher than the predetermined voltage when the operation enable signal is supplied to the voltage generator. Accordingly, the drain voltage to be applied to the memory cell is quickly increased to eliminate the occurrence of delays in access.

The fourth aspect of the invention is configured such that a semiconductor memory device is made up of an electrically writable non-volatile semiconductor memory device and comprises a voltage generator for generating a drain voltage to be applied to a read-out subject memory cell during read operation, the drain voltage being applied to a plurality of memory arrays, wherein the memory array has switching means for subjecting the drain voltage to be applied from the voltage generator to on-off control in response to a selection signal.

According to the fourth aspect of the invention, the following operation is effected.

The drain voltage generated in the voltage generator when the read operation enable signal is supplied thereto, and the thus generated drain voltage is applied to each memory array. In each memory array, switching means is subjected to on-off control in response to the selected signal, and the drain voltage is applied only to the selected memory array.

The fifth aspect of the invention is configured such that a semiconductor memory device is made up of an electrically writable non-volatile semiconductor memory device and comprises a voltage generator made up of a plurality of memory arrays for generating a drain voltage to be applied to a read-out subject memory cell during read operation, wherein the voltage generator is provided for every plurality of memory arrays, and when the memory array is selected, a voltage generator corresponding to the selected memory array generates the drain voltage and applies the drain voltage to the selected memory array.

According to the fifth aspect of the invention, the following operation is effected.

The drain voltage is generated by the voltage generator which is provided corresponding to the selected memory array during read operation, and it is applied to the selected memory array.

DETAILED DESCRIPTION OF THE INVENTION

Figure 1:
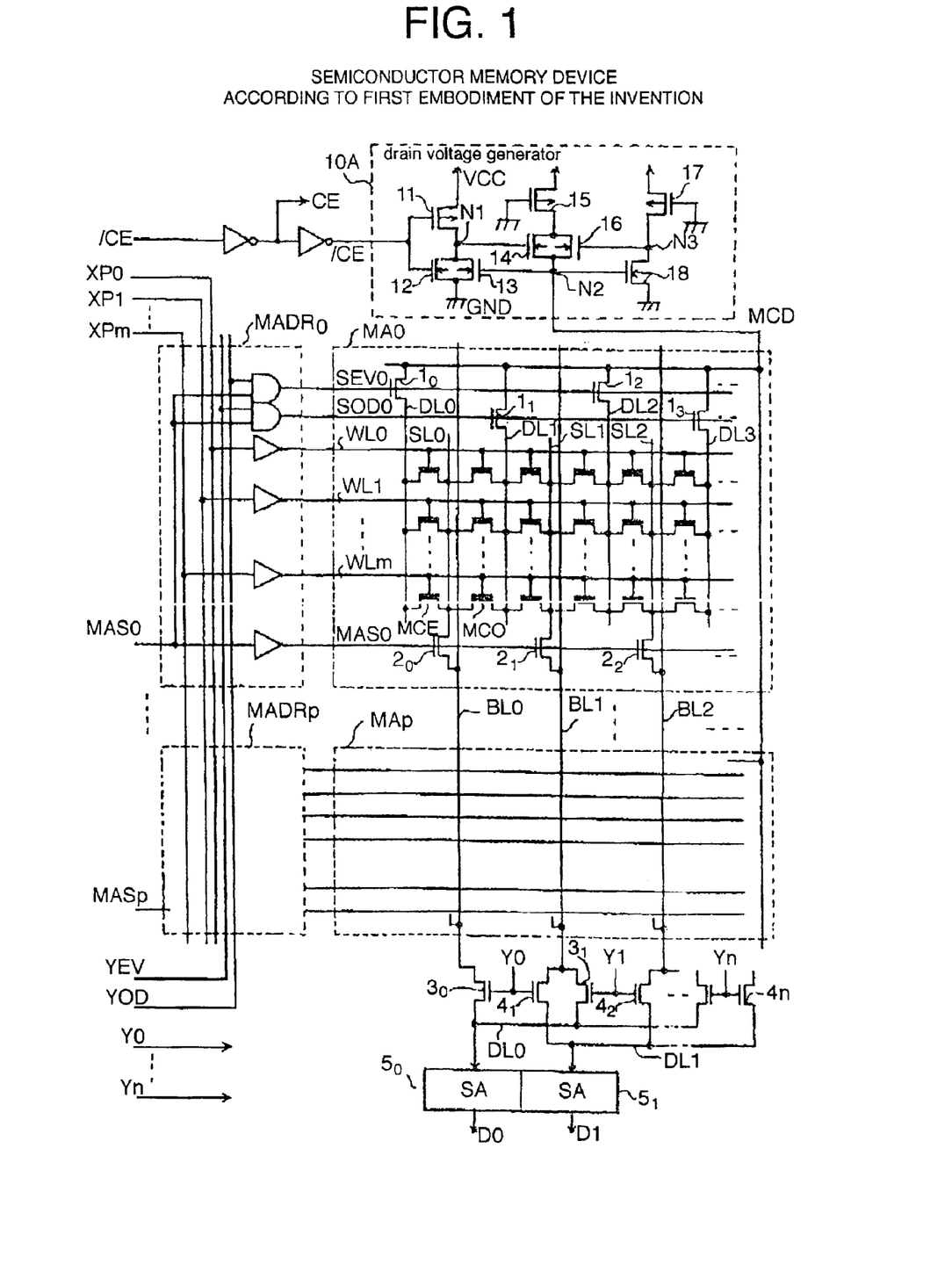
FIG. 1 is a circuit configuration of a semiconductor memory device according to a first embodiment of the invention.

First Embodiment:

FIG. 1 shows a semiconductor memory device according to a first preferred embodiment of the present invention.

The semiconductor memory device has a drain voltage generator 10A which differs from the drain voltage generator 10 shown in FIG. 2.

This semiconductor memory device is a non-volatile semiconductor memory capable of an electrical writing. The semiconductor memory also has a plurality of memory cell arrays MAk (k=0 to p) for storing data therein. Each memory array MAk has the same configuration, and, for example, as shown in a memory array MA0, it has a plurality of word lines WLi (I=0 to m), which are arranged in parallel with one another, and a plurality of drain lines DLj (j=0 to n) which are arranged to intersect the word lines WLi. Further, a plurality of source lines SLj are arranged in parallel with one another between each of the drain lines DLj and DLj+1.

Memory cells MCEi, j at the even numbered side are connected to the word lines WLi, drain lines DLj, and source lines SLj, and memory cells MCOi,j at the odd numbered side are connected to the word lines WLi, drain lines DLj+1, and source lines SLj.

The memory cells MCE, MCO are FET each of which has a floating gate. A control gate, a drain and a source thereof are respectively connected to the corresponding word line WL and drain line DL, and source line SL.

In the case where an electric charge is absent on the floating gate of each of the memory cells MCE, MCO, a threshold voltage of the FET is lowered so that the FET turns ON (e.g., memory content "1"), while in the case where the electric charge is present, the threshold voltage of the FET is increased so that the FET turns OFF (e.g., memory content "0"). Since the floating gate is isolated from other electrodes, if a high voltage is applied to the word lines WL to accumulate the electric charge, the memory content is stored even upon power-down.

Each of the drain lines DLj is connected to the drain voltage MCD via an NMOS1$_j$. An even numbered selection signal SEV is supplied to a gate of an even numbered NMOS1$_j$, and an odd numbered selection signal SOD is supplied to a gate of an odd numbered NMOS1$_j$ wherein they are subjected to on-off control.

Further, the source lines SLj are connected to bit lines BLj via NMOS2$_j$ which are in common subjected to on-off control by a memory array selection signal MAS. The source lines SLj of each of the memory arrays MA are connected to the bit lines BLj via the NMOS2$_j$.

Still further, a bit line BL0 is connected to a data line DL0 via an NMOS3$_0$, and a bit line BLn is connected to a data line DL1 via an NMOS4$_n$. Further, the bit lines BL$_j$ to BL$_{n-1}$ are connected in common to the drain lines DL0, DL1 via NMOS 3$_1$ to NMOS3$_{n-1}$ and e NMOS 41 to NMOS4$_{n-1}$. NMOS 3$_j$ and NMOS4$_{j+1}$ are subjected to on-off control in response to a bit line selection signal Yj, respectively.

The drain lines DL0, DL1 are connected to sense amplifiers 5$_0$, 5$_1$, and data D0, D1 each having a predetermined logical level are outputted from the sense amplifiers 5$_0$, 5$_0$, The selection signal relative to the word lines WL of each memory array MA, the even numbered selection signal SEV, the odd numbered selection signal SOD, and the memory array selection signal MAS are supplied from corresponding memory array driving circuits MADRs in response to word line selection signals XP0 to XPm, memory array selection signal MAS0 to MASp, and even and odd numbered selection signals YEV and YOD which are outputted from an address decoder, not shown, respectively. A bit line selection signal Y relative to the NMOSs 3, 4 is supplied from the address decoder.

Meanwhile, the drain voltage MCD is applied in common from the drain voltage generator 10A to each memory array MA. The drain voltage generator 10A generates the drain voltage MCD (e.g., 1.2V) which is sufficiently lower than the power supply voltage VCC (e.g., 3V) for read operation of each memory array MA when the semiconductor memory device is rendered in an active state in response to a chip selection signal /CE.

The drain voltage generator 10A has a PMOS transistor 11 and an NMOS12 which are controlled in conductive state by the chip selection signal /CE. A source of the PMOS11 is connected to the power supply voltage VCC, and a drain thereof is connected to a node N1. A drain of the NMOS12 is connected to the node N1 and a source thereof is connected to the ground voltage GND.

Further, a drain of an NMOS13 is connected to the node N1, and a source and a gate thereof are connected to the ground voltage GND and a node N2. A source of an NMOS14 is connected to the node N2, and a gate thereof is connected to the node N1. A drain of the NMOS14 is connected to the power supply voltage VCC via a PMOS15 a gate of which is connected to the ground voltage GND.

Still further, a drain and a source of an NMOS16 are connected to the drain and source of the NMOS14, and a gate of the NMOS16 is connected to each drain of the PMOS17 and the NMOS18. A gate and a source of a PMOS17 are connected to the ground voltage GND and power supply voltage VCC, respectively, and a gate and a source of an NMOS18 are connected to the node N2 and the ground voltage GND, respectively. The drain voltage MCD is outputted from the node N2.

Each on resistance of the PMOS17 and the NMOS18 is set to be sufficiently larger than that of the PMOS11 and the NMOS12.

An operation of the semiconductor memory device according to the first embodiment is described next.

With the semiconductor memory device having the foregoing configuration, in the case where read operation is not effected relative to the memory cell MC, the chip selection signal /CE goes 'H' to set at a standby state. Accordingly, the PMOS11 and the NMOS12 turn ON and OFF, respectively, and the voltage of the node N1 becomes the ground voltage GND. When the voltage of the node N1 becomes the ground voltage GND, the NMOS14 turns OFF.

Meanwhile, since the PMOS15, 17 always turn ON, a voltage of a node N3 goes "H" so that the NMOS16 turns ON. As a result, the node N2 is connected to the power supply voltage VCC via the NMOS16, PMOS15 which turn ON, respectively, so that the voltage of the node N2 is increased. The voltage of the node N2 is applied to each gate of the NMOSs 13, 18 so that the NMOSs 13, 18 turn ON.

As a result, a voltage obtained by dividing the power supply voltage VCC by the PMOS17 and the NMOS18 is outputted to the node N3. The voltage of the node N3 is applied to the gate of the NMOS16. With such a feedback loop, the drain voltage MCD outputted from the node N2 is held at about 1.2 V which is sufficiently lower than the power supply voltage VCC. At this time, although a shoot-through current flows from the power supply voltage VCC to the ground voltage GND via the PMOS17 and the NMOS18 which turn ON, respectively, the shoot-through current has a very small value since each on resistance of the the PMOS17 and NMOS18 is set at a very large value.

In the case where the chip selection signal /CE is set at "L" to be rendered in active state so as to effect read operation relative to the memory cell, the PMOS11 and the NMOS12 turn ON and OFF, respectively. Meanwhile, the NMOS13 keeps ON so that the power supply voltage VCC is divided by the PMOS11 and the NMOS13 and the divided voltage is outputted to the node N1. The voltage of the node N1 is further applied to the gate of the NMOS 14. The drain voltage MCD outputted from the node N2 owing to such a feedback loop is held at about 1.2V which is sufficiently lower than the power supply voltage VCC in the same manner as the standby state.

The drain voltage MCD generated by the drain voltage generator 10A is applied to each memory array MA, and further applied to a drain of the memory cells MC at the even numbered side or odd numbered side via the drain lines DL of a memory array MAk selected in response to a memory array selection signal MASk. Further, an ON/OFF state of the memory cells MC connected to the word line WL selected in response to the selection signal, of the selected memory array MAk, is outputted to each bit line BL via each source line SL.

Each bit line BL is further selected by the bit line selection signal Y, and the state of each bit line BL is outputted to the data lines DL0, DL1, then it is converted into a predetermined logical level by the sense amplifiers $5_0$, $5_1$ and outputted as data D0, D1.

As mentioned above, since the semiconductor memory device of the first embodiment generates the drain voltage MCD even in the standby state which is substantially the same as that in the active state, it has the drain voltage generator 10A to which a feedback circuit made up of the NMOss16, 18 and PMOS17 is added. Further, the PMOS17 and the NMOS18 use a large on resistance, thereby restraining the increase of the shoot-through current. As a result, thereby obtaining an advantage of eliminating the occurrence of delays in access when switching from the standby state to the active state without substantially increasing current consumption.

Figure 3:
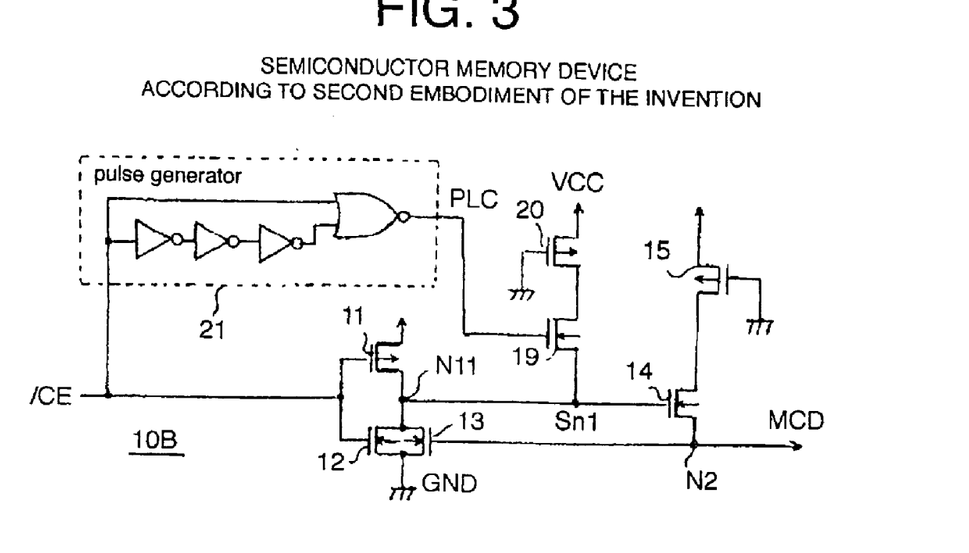
FIG. 3 is a circuit diagram of a drain voltage generator according to a second embodiment of the invention.

Second Embodiment:

FIG. 3 is a circuit diagram of a drain voltage generator according to a second embodiment of the invention. A drain voltage generator 10B is provided in place of the drain voltage generator 10 shown in FIG. 2, and the common components which are common to those in FIG. 2 are depicted by common reference numerals.

The drain voltage generator 10B provides an NMOS19, a PMOS20, and a pulse generator 21 in the drain voltage generator 10 in FIG. 2. A source of the NMOS19 is connected to a node N1, and a drain thereof is connected to the power supply voltage VCC via the PMOS20. The pulse generator 21 generates a pulse signal PLS, which goes "H" for a definite period of time, at the falling of a chip selection signal /CE, and the pulse signal PLS is supplied to a gate of the NMOS19. A gate of the PMOS20 is connected to the ground voltage GND. Other configurations of the components are the same as those of the drain voltage generator 10 shown in FIG. 2.

Figure 4:
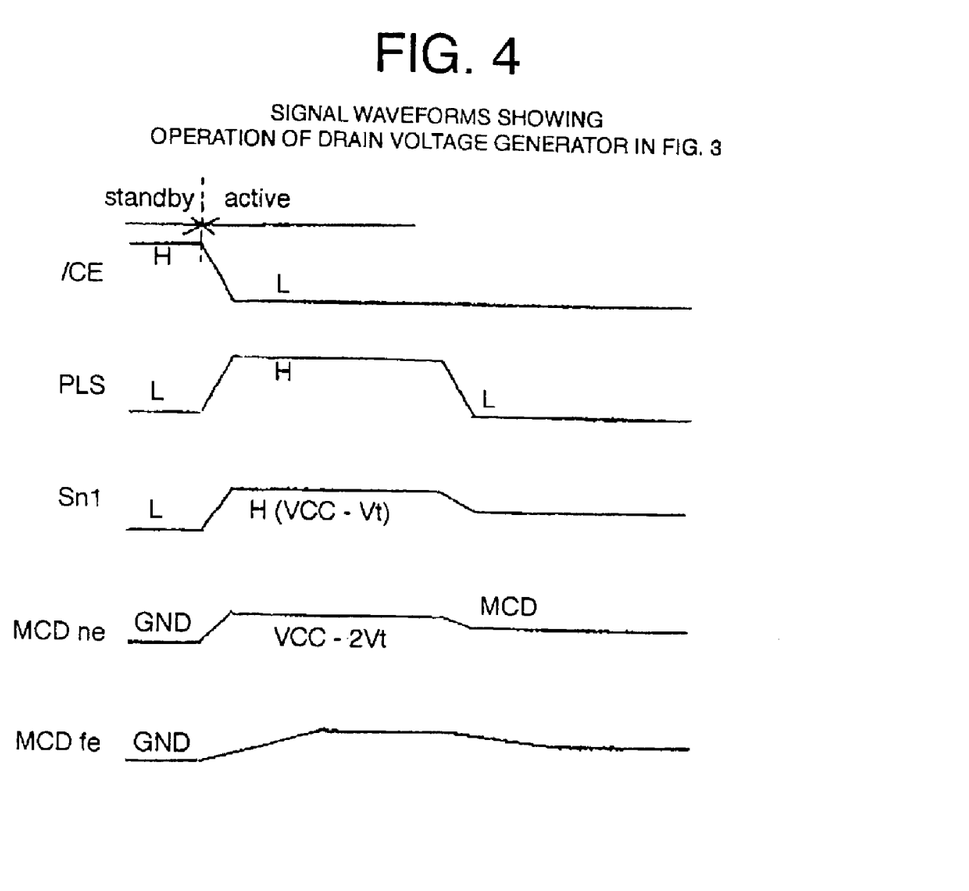
FIG. 4 shows signal waveforms showing the operation of the drain voltage generator in FIG. 3.

FIG. 4 shows signal waveforms showing the operation of the drain voltage generator in FIG. 3. The operation of the drain voltage generator in FIG. 3 is now described with reference to FIG. 4.

At a standby state, the chip selection signal /CE is "H", and the pulse signal PLS outputted from the pulse generator 21 is "L". Accordingly, a PMOS11 and the NMOS19 turn OFF, but an NMOS12 turns ON. Asia result, a signal Sn1 of the node N1 goes "L" and the NMOS14 turns OFF. The drain voltage MCD outputted from the node N2 becomes the ground voltage GND at a near end (ne) and a far end (fe).

When the chip selection signal /CE falls accompanied by the start of read operation, the PMOS11 and the NMOS12 turn ON and OFF, respectively, so that the signal Sn1 of the node N1 goes "H". When the signal Sn1 of the node N1 goes "H", the NMOS14 turns ON so that the node N2 is connected to the power supply voltage VCC via the NMOS14 and the PMOS15 to increase the voltage of the node N2. The voltage of the node N2 is fed back to the gate of the NMOS13 so that the NMOS13 turns ON. As a result, a voltage obtained by dividing the power supply voltage VCC by the PMOS11 and NMOS13 is outputted to the node N1. The voltage of the node N1 is further applied to the gate of the NMOS14.

At the same time, the pulse signal PLS which is outputted from the pulse generator 21 for a definite period of time from the falling of the chip selection signal /CE goes SHE. Accordingly, the NMOS19 turns ON so that the signal Sn1 of the node N2 is pulled up toward the power supply voltage VCC side and is increased up to a voltage of VCC −Vt (where Vt is a threshold voltage of the transistor) at the maximum. Accordingly, a drain voltage MCDne at the near end is increased up to VCC −2Vt at the maximum. On the other hand, a drain voltage MCDfe at the far end is increased behind the drain voltage MCDne.

The pulse signal PLS returns to "L" upon elapse of a definite period of time from the falling of the chip selection signal /CE, so that the NMOS19 turns OFF. Accordingly, there does not occur the increase of the voltage of the signal Sn1 caused by the NMOS19, but the voltage remains kept as it is since the drain voltage MCD is increased up to a fixed voltage.

As mentioned above, the semiconductor memory device according to the second embodiment comprises the pulse generator 21 for generating the pulse signal PLS for a definite period of time when the standby state is changed to the active state, and the NMOS19 for pulling up the drain voltage MCD up to the power supply voltage VCC side in response to the pulse signal PLS. Accordingly, the drain voltage MCD quickly rises when switching from the standby state to the active state, thereby obtaining an advantage of eliminating the occurrence of delays in access.

Figure 5:
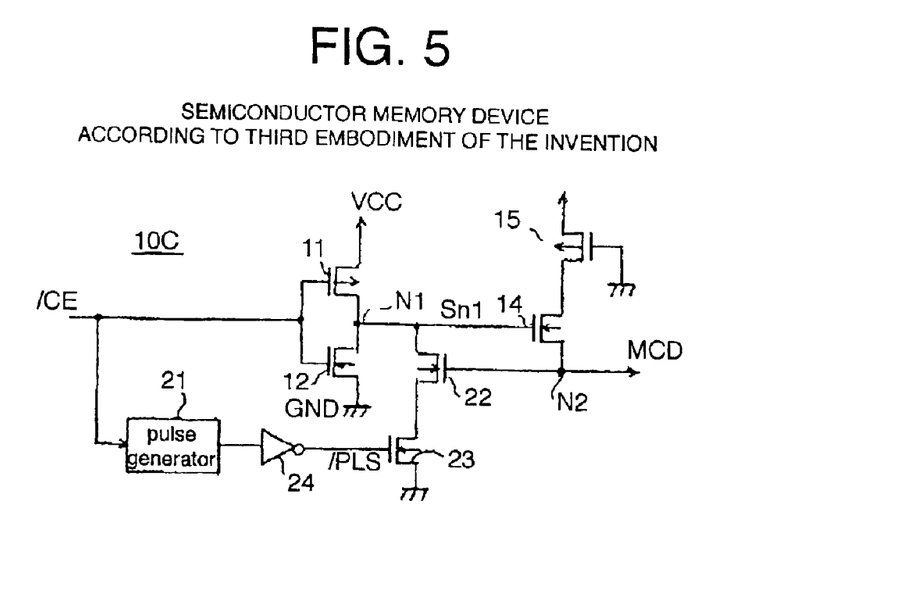
FIG. 5 is a circuit diagram of a drain voltage generator according to a third embodiment of the invention.

Third Embodiment:

FIG. 5 is a circuit diagram of a drain voltage generator according to a third embodiment of the invention. A drain voltage generator 10C is provided in place of the drain voltage generator 10 shown in FIG. 2, and the components which are common to those in FIG. 2 are depicted by common reference numerals.

The drain voltage generator 10C has NMOSs 22, 23 which are serially connected to each other instead of the NMOS13 of the drain voltage generator 10 in FIG. 2, and also a pulse generator 21 for controlling the NMOS23, and an inverter 24. A drain and a gate of the NMOS22 are connected to nodes N1, N2.

Further, the pulse generator 21 generates a pulse signal PLS which goes "H" for a definite period of time at the falling of a chip selection signal /CE, and the pulse signal PLS is inverted by the inverter 24, and the thus inverted pulse signal is supplied to a gate of the NMOS23 as a pulse signal /PLS. Other configurations of the components are the same as those shown in FIG. 2.

Figure 6:
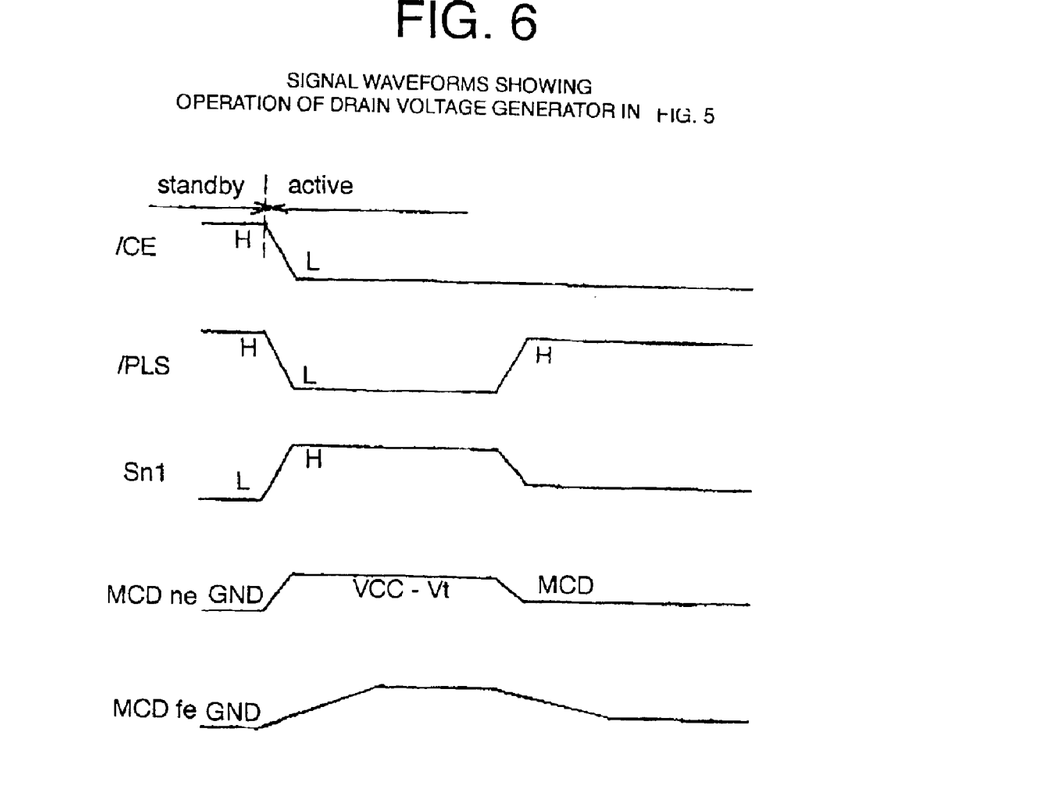
FIG. 6 shows signal waveforms showing the operation of the drain voltage generator in FIG. 5.

FIG. 6 shows signal waveforms showing the operation of the drain voltage generator in FIG. 5. The operation of the drain voltage generator in FIG. 5 is now described with reference to FIG. 6.

In a standby state, the chip selection signal /CE and the pulse signal /PLS are "H", respectively. Accordingly, the PMOS11 turns OFF, the NMOS12, 23 turn ON, and the drain voltage MCD becomes the ground voltage GND.

When the chip selection signal /CE falls accompanied by the start of read operation, the PMOS11 and the NMOS12 turn ON and OFF respectively, and at the same time, the pulse signal /PLS goes 'L' for a definite period of time from the falling of the chip selection signal /CE. Accordingly, the NMOS23 turns OFF so that the feedback operation by the NMOS22 is stopped, and the signal Sn1 of the node N1 is increased up to the power supply voltage VCC. As a result, the drain voltage MCD outputted to the node N2 becomes to a voltage of VCC −Vt.

Upon elapse of a definite period of time from the falling of the chip selection signal /CE, the pulse signal /PLS returns to "H" so that the NMOS23 turns ON. Accordingly, the drain voltage generator 10C becomes a circuit which is the same as the drain voltage generator 10 in FIG. 2, wherein a feedback operation is started by the NMOS22, and the drain voltage MCD is changed from the voltage of VCC −Vt to a predetermined voltage.

As mentioned above, the semiconductor memory device according to the third embodiment comprises the pulse generator 21 for generating the pulse signal /PLS for a definite period of time, and the NMOS23 for separating the node N1 from the ground voltage GND to pull up the drain voltage MCD up to the power supply voltage VCC side in response to the pulse signal /PLS. Accordingly, the drain voltage MCD quickly rises when switching from the standby state to the active state, thereby obtaining an advantage of eliminating the occurrence of delays in access.

Figure 7:
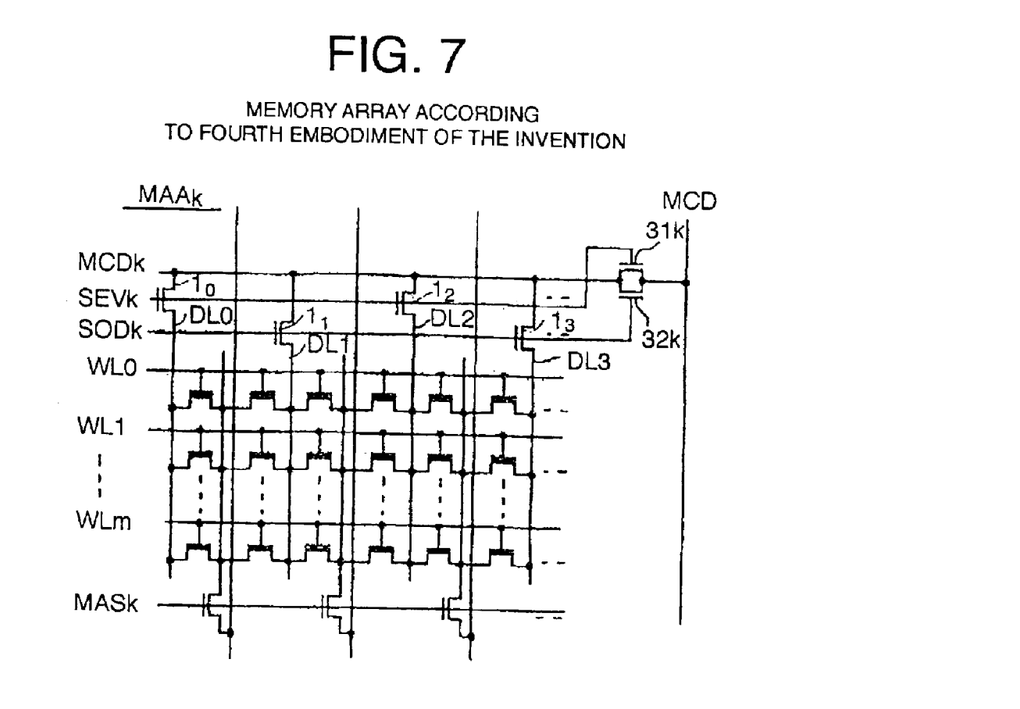
FIG. 7 is a circuit diagram of a memory array according to a fourth embodiment of the invention.

Fourth Embodiment:

FIG. 7 is a circuit diagram of a memory array according to a fourth embodiment of the invention. A memory array MAAk (k=0 to p) is provided in place of each memory array MA0 to MAp in FIG. 2, and components which are common to those in FIG. 2 are depicted by common reference numerals.

The memory array MAAk is configured to apply a drain voltage MCD generated by a drain voltage generator 10 to drain lines DL0 to DLn via NMOSs $31_k$, $32_k$ for switching purpose.

The NMOSs $31_k$, $32_k$ are connected in parallel to each other, and the drain voltage MCD is applied to each input side of the NMOSs $31_k$, $32_k$, and they are subjected to on-off control in response to an even numbered selection signal SEVk and an odd numbered selection signal SODk. Each output side of the NMOSs $31_k$, $32_k$ is connected to the drain lines DL0 to DLn via NMOS $1_0$ to NMOS $1_n$. Other configurations of the components are the same as those shown in FIG. 2.

With the semiconductor memory device having such a memory array MAA, the NMOSs $31_k$, $32_k$ of the selected memory array MMk turn ON, and all the NMOSs $31_j$, $32_j$ of the non-selected memory array MMA$_j$(j≠k) turn OFF.

Accordingly, the parasitic capacitance of the load of the drain voltage generator 10 is reduced so that the drain voltage MCD rises normally when switching from the standby state to the active state.

As mentioned above, according to the semiconductor memory device of the fourth aspect of the invention, each memory array MAA has the NMOS 31, 32 for switching purpose so as to receive the drain voltage MCD. Accordingly, the non-selected memory array MAA is separated from the load side of the drain voltage generator 10, so that the parasitic capacitance of the load of the drain voltage generator 10A can be reduced. As a result, the drain voltage MCD rises normally when switching from the standby state to the active state, thereby obtaining an advantage of eliminating the occurrence of delays in access.

Figure 8:
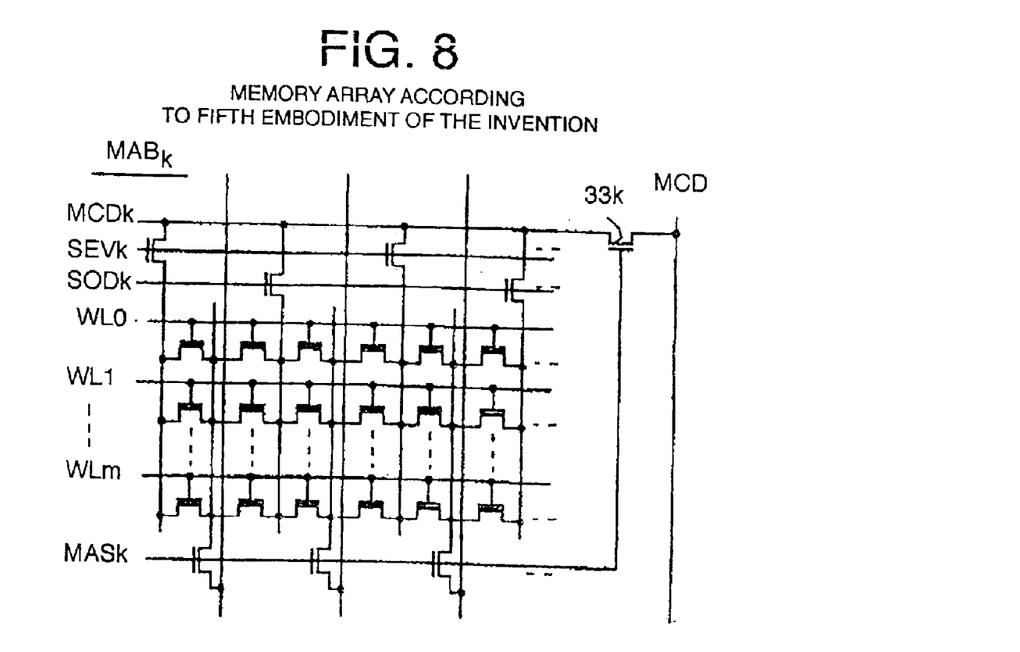
FIG. 8 is a circuit diagram of a memory array according to a fifth embodiment of the invention.

Fifth Embodiment:

FIG. 8 is a circuit diagram of a memory array according to a fifth embodiment of the invention. A memory array MABk (k=0 to p) is provided in place of the memory arrays MA0 to MAp in FIG. 2.

According to the memory array MABk of the fourth embodiment, an NMOS $33_k$ is provided in place of the NMOSs $31_k$, $32_k$ for switching purpose of the memory array MAAk in FIG. 7, and the NMOS $33_k$ for switching purpose is subjected to on-off control in response to a memory array selection signal MASk. Other configurations of the components are the same as those shown in FIG. 7.

Since the memory array MABk has small number of NMOSs for switching purpose compared with the memory array MAAk in FIG. 7, there is an advantage that a circuit scale can be reduced in addition to the advantage of the fourth embodiment of the invention.

Figure 9:
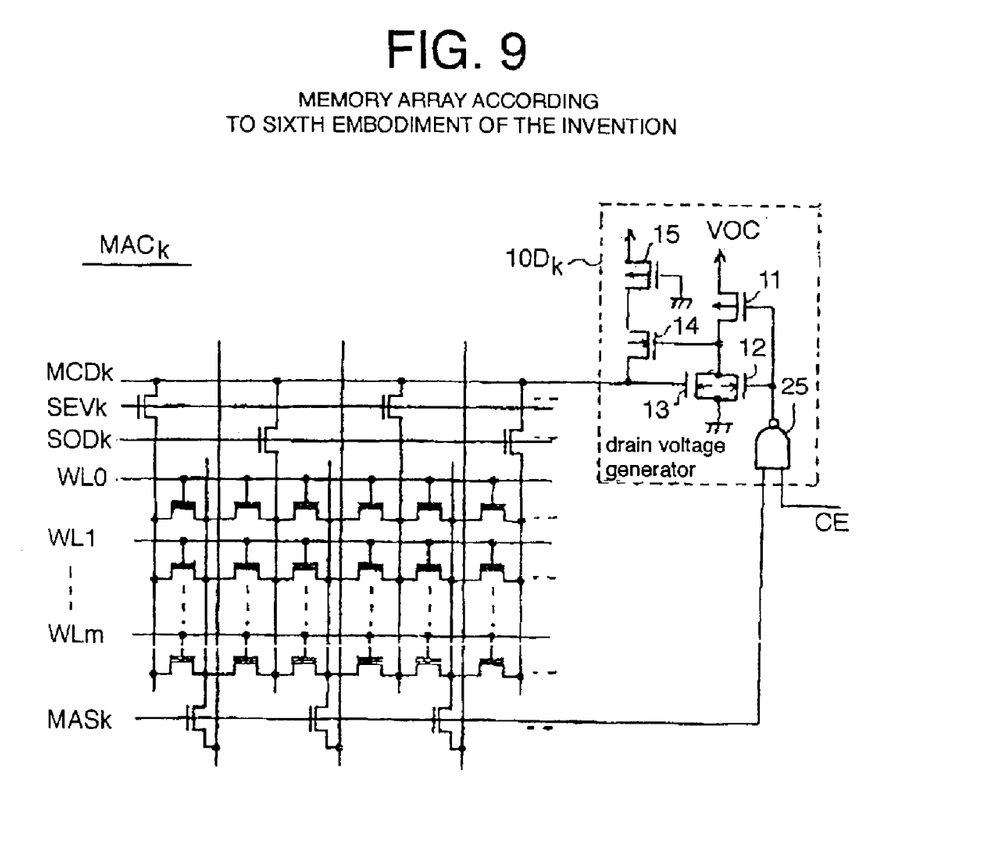
FIG. 9 is a circuit diagram of a memory array according to a sixth embodiment of the invention.

Sixth Embodiment:

FIG. 9 is a circuit diagram of a memory array according to a sixth embodiment of the invention. A memory array MACk (k=0 to p) is provided with adedicated drain voltage generators 10Ek, and it is provided in place of the memory array MA0 to MAp in FIG. 2. By the provision of the drain voltage generator 10Ek, the drain voltage generator 10 is deleted.

The circuit configuration of the memory cell of the memory array MACk is the same as that of the memory array MA0 to MAp in FIG. 2.

Meanwhile, each drain voltage generator 10Ek has a non-disjunction gate (NAND) 25 in addition to the drain voltage generator 10 in FIG. 2. That is, a chip selection signal CE and the memory array selection signal MASk relative to the memory array MACk are NORed, which serves as a chip selection signal /CE for controlling the drain voltage generator 10.

As a result, only the drain voltage generator 10Ek of the selected memory array MACk operates, and a drain voltage MCDk generated by the drain voltage generator 10Ek is applied to the memory array MACk.

As mentioned above, according to the sixth embodiment, each memory array MACk has the dedicated drain voltage generator 10Ek. As a result, it is possible to generate the appropriate drain voltage MCD without being influenced by the entire storage capacity by dividing the semiconductor memory device into memory arrays each having appropriate storage capacity, thereby obtaining an advantage of eliminating the occurrence of delays in access.

The invention is not limited to the first to sixth embodiments set forth above, but can be modified variously. There are, for example, the following modifications.

(a) The configurations of the drain voltage generators 10A to 10D are not limited to those as illustrated. The drain voltage generator is sufficient to be configured to generate a appropriate drain voltage MCD not to effect an erroneous writing during read operation.

(b) Although the drain voltage generator in FIG. 1 has a plurality of memory arrays MA, the invention can be applied to a semiconductor memory device which is configured by one memory array.

(c) The memory array MA shown in FIG. 1, FIGS. 7 to 9 are configured by separating the memory cells MCE at the even numbered side and the memory cells MCO at the odd numbered side. The invention is not limited to such a configuration.

As described in detail, according to the first aspect of the invention, the drain voltage generator has the second generating means for generating the drain voltage with a driving performance which is smaller than a predetermined driving performance irrespective of the presence of the operation enable signal. As a result, the drain voltage is always held at a predetermined voltage, thereby obtaining an advantage of eliminating the occurrence of delays in access.

According to the second and third aspects of the invention, the drain voltage generator is configured to temporarily generate the drain voltage which is higher than a predetermined voltage when the operation enable signal is supplied thereto. As a result, it is possible to prevent the quick increase of the drain voltage to be applied to the memory cell when starting read operation, thereby obtaining an advantage of restraining the occurrence of delays in access.

According to the fourth aspect of the invention, a plurality of memory arrays constituting the drain voltage generator have switching means for subjecting the drain voltage generated by the voltage generator to an on-off control. Accordingly, ine drain voltage is applied only to the selected memory array so that a predetermined drain voltage is held, so that there is no likelihood of the occurrence of delays in access.

According to the fifth aspect of the invention, the plurality of memory arrays constituting the semiconductor memory device have the dedicated drain voltage generators. Accordingly, the drain voltage is generated by the drain voltage generator provided corresponding to the memory array which is selected during read operation, and it is applied to the selected memory array. Accordingly, it is possible to eliminate the occurrence of delays in access without being influenced by the entire storage capacity by dividing the semiconductor memory device into a plurality of memory arrays.

What is claimed is:

1. A semiconductor memory device, comprising:

a memory cell array having a plurality of memory cells, each memory cell is arranged at an intersection between a drain line and a word line; and a voltage generator having a first generator and a second generator for generating a drain voltage to be applied to the drain line, wherein the first generator applies the drain voltage to the drain line when an enable signal is input, the second generator applies the drain voltage to the drain line regardless of inputting the enable signal.

2. The semiconductor device according to claim 1, wherein a voltage level of the drain voltage applied by the first generator in the voltage generator is temporarily higher than a predetermined voltage level.

3. A semiconductor memory device, comprising:

a memory cell array having a plurality of memory cells, each memory cell is arranged at an intersection between a drain line and a word line; and a voltage generator which has a voltage generating circuit for generating the drain voltage having a predetermined value by feed backing an output voltage to an input side based on the enable signal, and feedback stop circuit for temporarily stopping the feedback of the output voltage to increase the drain voltage when the enable signal is supplied thereto.

4. A semiconductor memory device, comprising:

a memory cell array having a plurality of memory cells, each memory cell is arranged at an intersection between a drain line and a word line; and a voltage generator for generating a drain voltage to be applied to the drain line;

and wherein the memory array has switching circuit for subjecting the drain voltage to be applied from the voltage generator to on-off control in response to a selection signal.

5. A semiconductor memory device, comprising:

a plurality of memory cell arrays each of which has a plurality of memory cell is arranged at an intersection between a drain line and a word line; and a voltage generator for generating a drain voltage to be applied to the drain line;

a voltage generator which is provided for every plurality of memory arrays, and wherein when the memory array is selected, the voltage generator corresponding to the selected memory array generates the drain voltage and applies the drain voltage to the selected memory array.

* * * * *